United States Patent [19]

Kaiser et al.

[11] Patent Number: 4,833,680
[45] Date of Patent: May 23, 1989

[54] METHOD OF CONTROLLING THE OPTICAL POWER OUTPUT OF A LASER, AND CIRCUIT FOR CARRYING OUT THE METHOD

[75] Inventors: Norbert Kaiser, Tamm; Martin Mittrich, Leonberg, both of Fed. Rep. of Germany

[73] Assignee: Alcatel N.V., Amsterdam, Netherlands

[21] Appl. No.: 27,445

[22] Filed: Mar. 18, 1987

[30] Foreign Application Priority Data

Mar. 18, 1986 [DE] Fed. Rep. of Germany ....... 3608930

[51] Int. Cl.$^4$ .............................................. H01S 3/13
[52] U.S. Cl. ........................................ 372/29; 372/33; 372/38; 455/609
[58] Field of Search .................. 455/609, 613; 372/29, 372/6, 32, 33, 38, 34

[56] References Cited

U.S. PATENT DOCUMENTS

| | | | |
|---|---|---|---|
| 4,347,610 | 8/1982 | Meuleman | 372/29 |
| 4,369,525 | 1/1983 | Breton et al. | 455/618 |
| 4,399,566 | 8/1983 | Roullet et al. | 455/613 |
| 4,504,976 | 3/1985 | Beaudet | 455/611 |

FOREIGN PATENT DOCUMENTS 0107284 8/1980 Japan ...................................... 372/29

OTHER PUBLICATIONS

R. E. Epworth, "Subsystems for High Speed Optical Links", *Proc. of the 2nd European Conference on Optical Fiber Communications*, 1976.

*Primary Examiner*—William L. Sikes
*Assistant Examiner*—B. Randolph
*Attorney, Agent, or Firm*—Spencer & Frank

[57] ABSTRACT

An optical transmitter for digitally transmitting data by using NRZ pulses. The transmitter has a laser diode whose operating current consists of a bias current and a modulation current. A photodiode measures the optical performance of the laser diode. Also provided is a regulating device having a multiplier for multiplying the alternating component of a measuring signal transmitted by the photodiode with a signal beat, the latter having the frequency of the bit rate corresponding to the NRZ pulses, with the output signal of the regulating device setting the bias current via a control member to a value which is smaller, by a predetermined amount, than the laser threshold current.

7 Claims, 1 Drawing Sheet

METHOD OF CONTROLLING THE OPTICAL POWER OUTPUT OF A LASER, AND CIRCUIT FOR CARRYING OUT THE METHOD

The present invention relates to an optical transmitter including a laser diode.

Such a transmitter is described by R. E. Epworth, "Subsystems for high speed optical links", Proc. of the 2nd European Conference on Optical Fiber Communication, Paris, 1976, pp. 377 to 382. There, the minimum power and the maximum power are measured, and the former is subtracted from the latter. From the measurement results so obtained, a signal for controlling the modulation current and a signal for the bias current are derived, and each of the control signals is applied to a separate control device implemented with a comparator.

SUMMARY OF THE INVENTION

The object of the present invention is to provide for automatic adjustment of such transmitter if there is a change in the laser diode characteristics.

This object is attained in an optical transmitter including a laser diode for producing a light signal in response to an operating current composed of a bias current and a modulating current, means connected to the diode for generating the modulating current based on a data signal whichis synchronous with a clock pulse, a first regulating device including a first setting member connected for controlling the modulating current, a second regulating device including a second setting member connected for controlling the bias current, and a photodiode disposed for receiving light emitted by the laser diode and for producing an electrical signal representative of the laser diode light output power, by the improvement wherein the first regulating device comprises means connected between the photodiode and the first setting member for acting on the first setting member in a manner to cause the modulating current to vary inversely with variations in the actual laser diode light output power, and the second regulating device comprises means connected between the photodiode and the second setting member, and connected to receive a signal corresponding to the clock pulse, for acting on the second setting member in a manner to cause the bias current to vary inversely with variations in the average value of the product of the signal corresponding to the clock pulse and the electrical signal produced by the photodiode.

BRIEF DESCRIPTION OF THE DRAWING

Further advantageous details of the invention are set forth in the subclaims and will now be described with reference to the accompnaying drawing, which shows an embodiment of the invention, and in which:

DETAILED DESCRIPTION OF THE PREFERRED EMBODIMENTS

Figure 1:
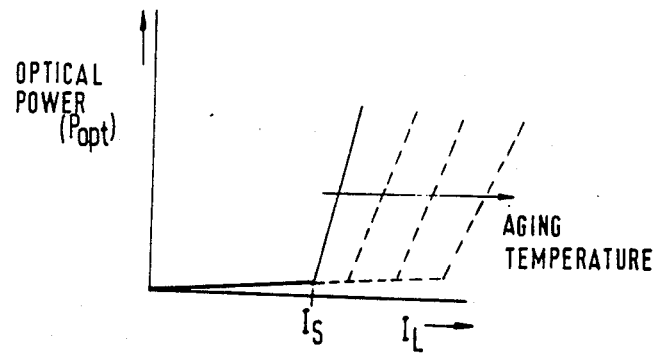
FIG. 1 shows the characteristic of a laser diode.

FIG. 1 shows the characteristic of a semiconductor laser diode. As can be seen, high light efficiency is obtained only from a threshold current $I_S$. For data transmission or light power modulation, the laser must therefore be operated in the region of the steep portion of the characteristic. Due to aging and temperature effects, the threshold current increases and the steepness of the steep portion decreases. Conventional control systems do not take these effects into account or contain expensive circuitry. As is conventional, a bias current $I_V$ greater than the threshold current $I_S$ is set and maintained constant. To this bias current $I_V$, a modulating current is added which corresponds to the signal to be transmitted, for which positive values are assumed here. If, during digital signal transmission, the laser current $I_L$ becomes smaller than the threshold current $I_S$ when a logic 0 is transmitted, the edge from logic "0" to logic "1" is converted to light power with a delay according to the formula $$t_v = \tau \cdot \ln\left(\frac{I_{Mod}}{I_{Mod} + I_v - I_S}\right); I_v \leq I_S$$

where
$\tau$ = electron lifetime (a few ns)
$t_v$ = delay

To permit reliable transmission of a logic "1", therefore, the requirement $I_L \geq I_S$ should be met as far as possible.

As the peak power of the laser is limited, and the ratio between the optical powers of the transmitted 1s and 0s is to be as large as possible, the minimum laser current (for the transmission of a 0) should be set to a value near the threshold current $I_S$. This threshold current not only varies from device to device but also is strongly temperature- and aging dependent, as shown in FIG. 1. In addition, the slope of the characteristic decreases with increasing temperature and aging. To take these effects into account, if the bias current $I_V$ is regulated at a constant value, it must be chosen to be either greater than the value of the threshold current, in which case it is not possible to transmit the maximum possible light power, or close to the threshold current $I_S$, in which case the maximum possible light power is utilized, but the shift of the characteristic may result in a reduction of the light power.

The invention is predicated on the following recognition:

During digital transmission of NRZ pulses at the bit rate $f_B$, the shortest pulse duration is $T = (1/f_B)$ (clock period). A random sequence of pulses of duration T in the pattern n·T (n=integer) has a power density spectrum which reaches 0 at $f_B$. If the turnon delay of the laser is increased by decreasing the bias current $I_V$, the optical pulse width decreases, the shortest pulse duration becoming smaller than T. In the power density spectrum the zero point then moves away from $f_B$ and a measurable value appears at the frequency $f_B$ which increases with increasing turnon delay.

According to the invention, the laser is operated in the region of the knee in its characteristic, such that a line of minimum magnitude occurs in the frequency at $f_B$. The criterion is thus the presence of a delay which is kept very small to ensure reliable transmission of the signals and, thus, permits the maximum optical power to be transmitted.

The spectral line resulting from the turnon delay can be detected, for example, by being mixed with the clock frequency $f_B$. The low-frequency components of the signal at the output of the mixer is used to control the bias current $I_V$ in such a way that the delay falls below a predetermined value (in the following embodiment, the nominal value $I_V$ determines this minimum permissible delay). In a practical system in which the spectral line does not disappear completely even during operation above the threshold current, this lower limit serves to prevent the bias current from being increased to too high a value. The steady component of the laser power could thus become too large, or the laser would be destroyed.

Figure 2:
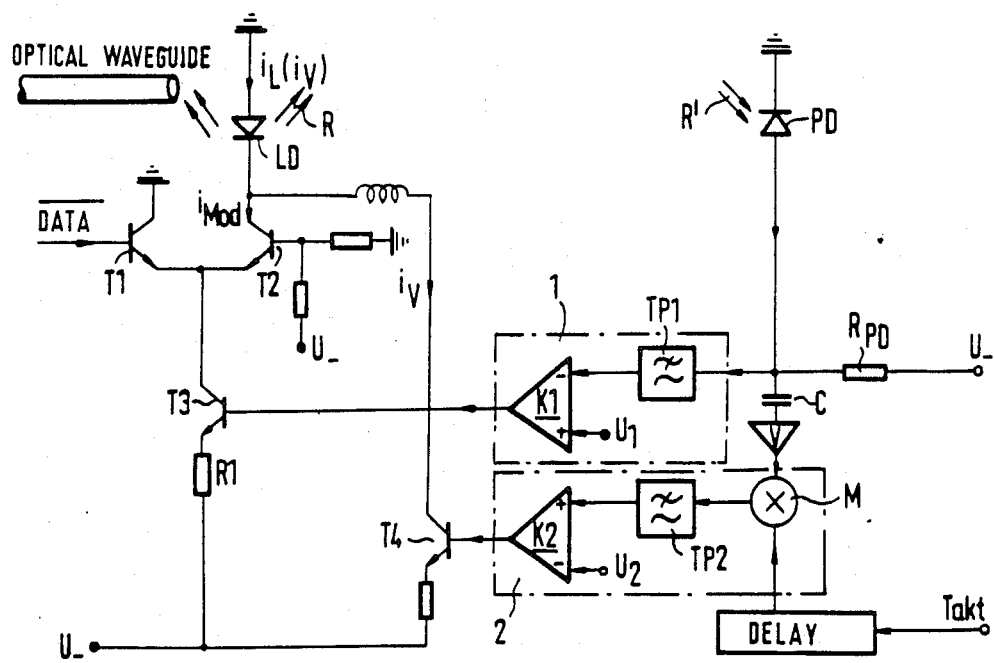
FIG. 2 is a schematic diagram of a circuit according to the invention.

The invention will now be described with reference to the optical transmitter shown in the schematic circuit diagram of FIG. 2. The inverted data signal DATA is applied to a differential amplifier consisting of a first transistor stage T1, a second transistor stage T2, and a current source formed by a transistor stage T3 and a resistor R1. The output of the differential amplifier delivers the modulating current $I_{Mod}$ for the laser diode LD. Part of the optical power emitted by the laser diode LD, here a portion R' of the light R taken from the rear face of the laser, falls on a photodioxe PD, in which it is converted into a current proportional to the power. This current produces a voltage drop across a resistor $R_{PD}$. The average of this voltage is taken in a first low-pass filter TP1 and compared with a reference voltage $U_1$ which corresponds the desired value of the average power in a comparator K1 contained in a first controller 1. If this power decreases due to a disturbance, such as an increase in the temperature of the laser, the average of the photodiode current and, thus, the output voltage of the first low-pass filter TP1 decrease. The comparator K1 increases its output voltage, so that the modulating current $I_{Mod}$ increases under control of the transistor stage T3.

The alternating-current component produced in the photodiode PD passes through a capacitor C and an amplifier V to a multiplier M, whose output is connected via a second low-pass filter TP2 to one input of a comparator K2 in a second controller 2. The clock signa (bit-frequency $F_B$) is applied to the second input of the multiplier M. The phase relationship between the two signals supplied to the multiplier M is chosen so that the DC component of the output signal of the multiplier M is as large as possible—this may be done by delaying the clock signal-, and that a sufficient control range is present, i.e., upon turn-on of the device, at which, because of different acting-time constants (as will be explained later), a maximum modulating current $I_{Mod}$ occurs at a minimum bias current $I_V$, the output signal of the second low-pass filter TP2 must be so large that a final control element controlling the bias current $I_V$, e.g., the transistor T4 driven by the comparator K2, is rendered conductive, so that the bias current $I_V$ of the laser LD is increased. The voltage U2, which corresponds to the nominal value of the above-mentioned frequency line in the power density spectrum, is applied to the second input of the second comparator K2.

Another specific advantage of the invention consists in the fact that, in the absence of data or of the clock signal, the laser LD is automatically protected from excessive currents which may be caused upon return of data or the clock signal in other laser control systems having no specific protection. With the known average-value control, if no specific protective facility is provided for monitoring the data, the bias current increases during the applicaion of a continuous zero at the data input until the adjusted average output power value is reached. The bias current therefore assumes the value $I_S + (I_{Mod}/2)$, i.e., increases beyond the threshold value. When the data input changes from 0 to 1, the modulating current is applied momentarily, i.e., the preset maximum current $I_S$ plus $I_{Mod}$ is exceeded, and the laser may be damaged or even destroyed. With the invention, after nonappearance of data and/or the clock signal, a minimum signal appears at the output of the second low-pass filter TP2. The bias current is thus reduced to the minimum value mentioned above. Under worst-case conditions, the modulating current increases to its maximum value, which, together with the minimum bias current, does not exceed the peak value of current in present-day lasers. When the data and/or the clock signal reappear, the second comparator K2 slowly increases the bias current, while the modulating current decreases correspondingly. The control loop for the modulating current must therefore have a higher cutoff frequency than that for the bias current. Different time constants are also necessary for decoupling the two control loops.

Present-day housings for semiconductor lasers used for optical communication commonly contain the photodiode in addition to the laser diode coupler. It can be assumed that, during future mass production, the laser-to-fiber and laser-to-photodiode losses and the efficiency of the photodiode, i.e., the conversion of light into current, will vary so little from device to device that the resulting power variations in the fiber can be tolerated. With the present invention, the electronics need no longer be adjusted to the laser device, because not only the bias current but also the modulating current are readjusted, i.e., different characteristics are compensated for.

We claim:

1. Optical transmitter for digitally transmitting data by means of NRZ pulses, the transmitter comprising:
    a laser diode whose operating current consists of a bias current and a modulating current;
    input circuit means for receiving a data signal in the form of NRZ pulses and for providing a corresponding said modulating current for said laser diode;
    bias circuit means, including a control member, for providing said bias current for said laser diode;
    a photodiode for measuring the optical output power of said laser diode and for providing a corresponding measuring signal;
    and a first regulating means, having an output connected to said control member and including a multiplier with an output for multiplying signals provided at first and second inputs connected to respectively receive the alternating current component of said measuring signal delivered by the photodiode and a clock signal having a frequency corresponding to the bit rate of the NRZ pulses, for producing an output signal for setting the bias current, via said control member, to a predetermined value which is slightly smaller than the threshold current of said laser diode.

2. Optical transmitter according to claim 1, wherein said multiplier has an output and said first regulating means further comprises a low pass filter which produces an output signal, said low pass filter being connected to said output of said multiplier and a comparator for comparing the output signal of said low pass filter with a reference voltage which corresponds to said predetermined value to produce said output signal.

3. Optical transmitter according to claim 2, further comprising: a further control member included in said input circuit means; and an additional regulating means, having an input and an output, said input being connected to receive said measuring signal and said output being connected to said further control member, for setting the modulation current, depending on the D.C. component of said measuring signal delivered by said photodiode, such that the average output power of the laser diode is constant.

4. Optical transmitter according to claim 3, wherein said additional regulating means comprises an additional low pass filter for producing an output signal and an additional comparator for comparing said output signal from said additional low pass filter with an additional reference voltage which corresponds to the desired value of the average output power of said laser diode.

5. Optical transmitter according to claim 3, wherein said additional regulating means has a higher limit frequency, and therefore a shorter control time constant, than said first regulating means.

6. Transmitter according to claim 2, further comprising a delay device, connected to one of said inputs of said multiplier, for providing a delay such that the phase shift between the input signals of said multiplier produces an optimum DC component value in the output signal of the multiplier and a sufficiently large control range.

7. Transmitter according to claim 3, wherein each of said control and further control members comprises at least one transistor stage, and the output of each comparator is connected with the control input of a transistor stage of the respective control member.

* * * * *